(12) United States Patent
Caldwell

(10) Patent No.: US 7,242,393 B2
(45) Date of Patent: Jul. 10, 2007

(54) TOUCH SENSOR WITH INTEGRATED DECORATION

(75) Inventor: David W. Caldwell, Holland, MI (US)

(73) Assignee: TouchSensor Technologies LLC, Wheaton, IL (US)

( * ) Notice: Subject to any disclaimer, the term of this patent is extended or adjusted under 35 U.S.C. 154(b) by 133 days.

(21) Appl. No.: 10/272,047

(22) Filed: Oct. 15, 2002

(65) Prior Publication Data

US 2003/0122794 A1    Jul. 3, 2003

Related U.S. Application Data

(60) Provisional application No. 60/341,350, filed on Dec. 18, 2001, provisional application No. 60/341,550, filed on Dec. 18, 2001, provisional application No. 60/341,551, filed on Dec. 18, 2001, provisional application No. 60/334,040, filed on Nov. 20, 2001.

(51) Int. Cl.
*G09G 5/00*   (2006.01)
*G09G 5/08*   (2006.01)

(52) U.S. Cl. .................. 345/173; 345/175; 345/179
(58) Field of Classification Search ........ 345/173–179, 345/168; 341/22, 33, 34; 178/18.01–18.11
See application file for complete search history.

(56) References Cited

U.S. PATENT DOCUMENTS

| | | | |
|---|---|---|---|
| 4,954,823 A * | 9/1990 | Binstead ..................... 341/26 |
| 5,239,152 A | 8/1993 | Caldwell et al. ............. 200/600 |
| 5,598,527 A | 1/1997 | Debrus et al. .............. 345/173 |
| 5,610,380 A | 3/1997 | Nicolaisen |
| 5,736,686 A * | 4/1998 | Perret et al. .............. 178/18.11 |
| 5,760,715 A * | 6/1998 | Senk et al. ................... 341/33 |
| 5,917,165 A | 6/1999 | Platt et al. .................. 200/600 |
| 6,035,180 A | 3/2000 | Kubes et al. ................. 455/90 |
| 6,610,936 B2 * | 8/2003 | Gillespie et al. ......... 178/18.01 |
| 6,704,005 B2 * | 3/2004 | Kato et al. .................. 345/173 |
| 2002/0101399 A1 * | 8/2002 | Kubo et al. ................. 345/104 |
| 2003/0016211 A1 * | 1/2003 | Woolley ..................... 345/173 |

FOREIGN PATENT DOCUMENTS

EP    1152442 A2    11/2001    .................... 13/70

\* cited by examiner

*Primary Examiner*—Dennis-Donn Chow
(74) *Attorney, Agent, or Firm*—Jenner & Block LLP

(57) ABSTRACT

A switch panel includes one or more touch responsive switch devices and an integrated decorative fascia. Both the switch devices and decoration are applied to the same substrate, eliminating the need for a separate user interface panel. Each switch device can include one or more electrodes and a circuit for inducing an electric field about the electrode(s) and responding to disturbances to the electric field.

20 Claims, 10 Drawing Sheets

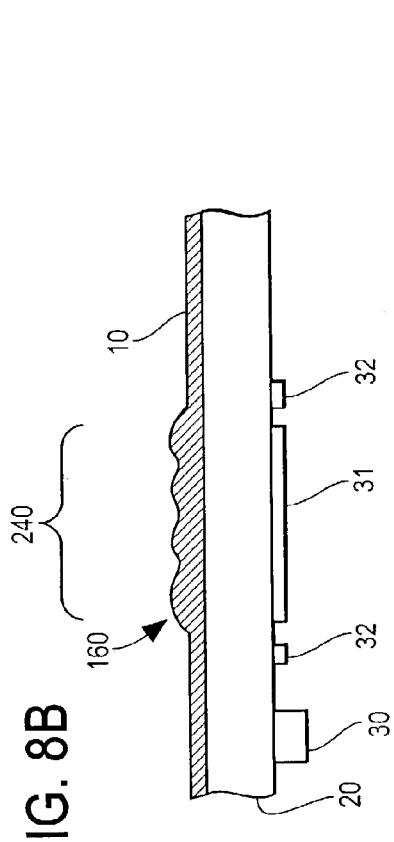
FIG. 8A
FIG. 8B
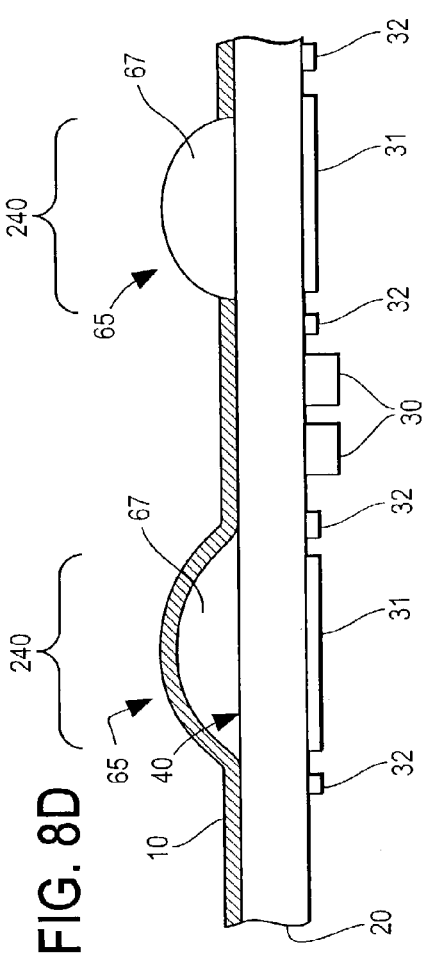
FIG. 8C
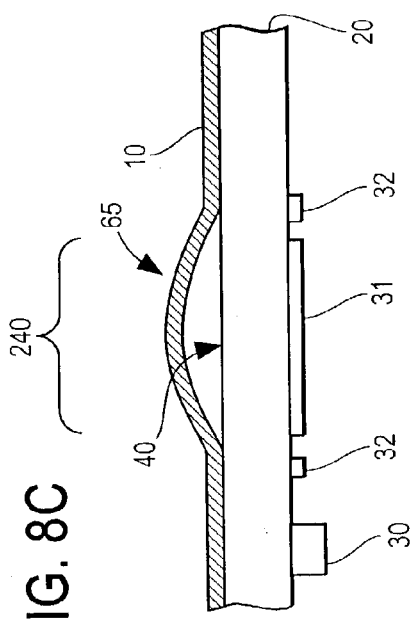
FIG. 8D

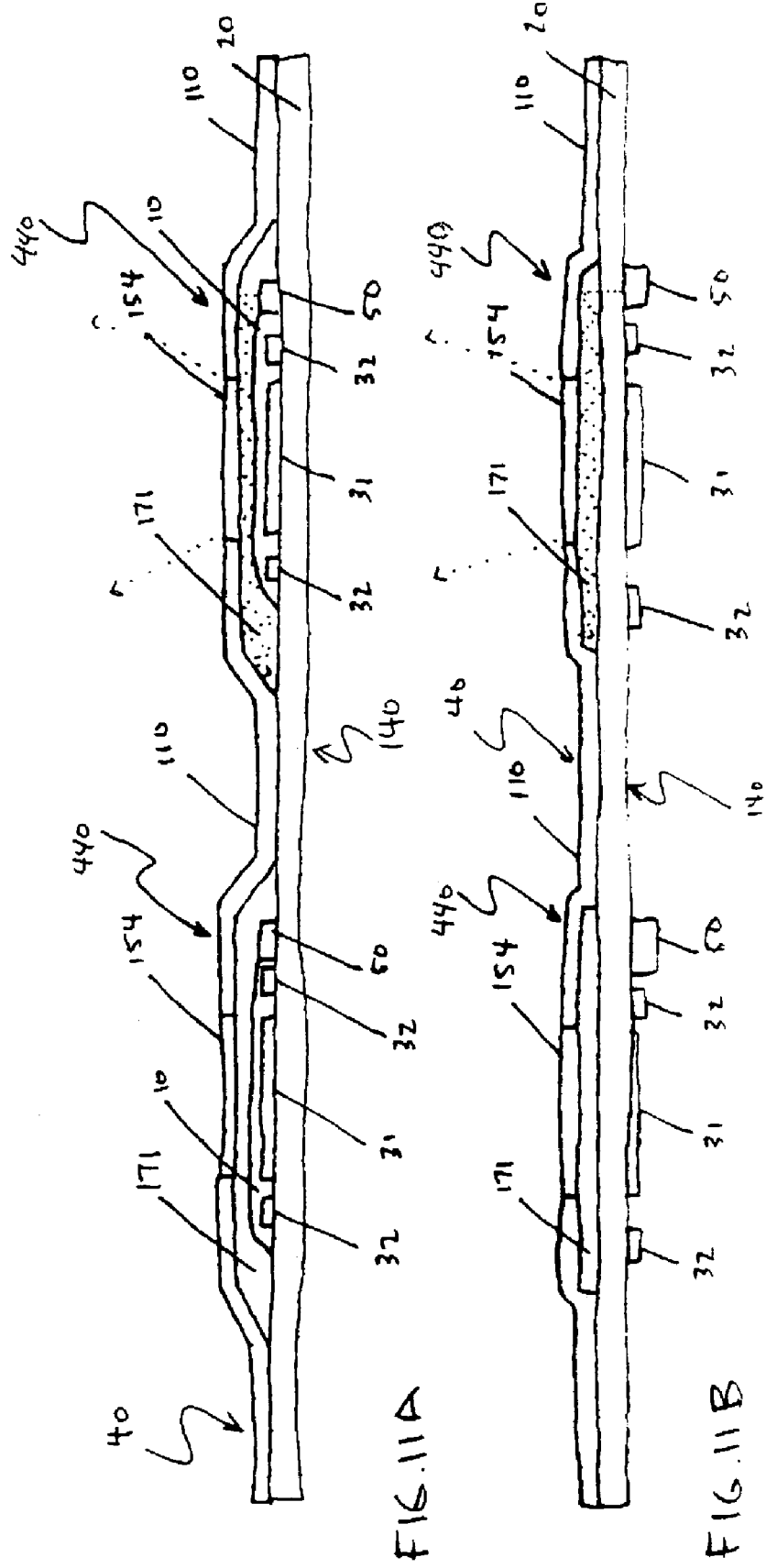

US 7,242,393 B2

TOUCH SENSOR WITH INTEGRATED DECORATION

CROSS-REFERENCE TO RELATED APPLICATIONS

This application claims priority from U.S. Provisional Patent Applications No. 60/334,040, filed on Nov. 20, 2001; and No. 60/341,350, No. 60/341,550 and No. 60/341,551, all filed on Dec. 18, 2001. The disclosures of the foregoing applications are hereby incorporated herein by reference.

BACKGROUND OF THE INVENTION

1. The Technical Field

The present invention relates to a control panel interface for applications using touch sensors as control input and output devices. More particularly, it relates to a control panel having a touch sensor and integrated decoration.

2. The Prior Art

Known touch sensors typically include a touch pad having one or more electrodes and an associated circuit that induces an electric field about the touch pad and responds to changes to the electric field when the electric field is disturbed by a stimulus such as a user's touch or proximity. The touch pad and associated circuit are typically disposed on a substrate such as a printed circuit board or glass panel. This touch sensor subassembly is then attached to a second substrate, typically a nonconductive panel made of glass or plastic, that forms the face of a control panel, which presents itself to the user of the controlled device and a portion of which (the "touch surface") a user touches or approaches to disturb the induced electric field and thus trigger the touch sensor. This second substrate typically includes a decorative layer disposed thereon. This decorative layer can serve to make the touch sensor more ergonomic, for instance, by alerting the user to the presence and location of an underlying touch pad, by informing the user of the response a particular touch pad will effect when triggered or by otherwise creating an easily managed human interface.

These known touch sensor assemblies protect the touch pad and associated circuitry from environmental conditions that exist at the touch surface while providing an aesthetic or ergonomic face. However, this design involves separating the touch sensor's touch surface from the corresponding touch pad and thus adds thickness to the touch sensor assembly as a whole. The associated separation of the touch surface from the touch pads of the sensor attenuates the strength of the electric field proximate the touch surface, and the increased thickness of the touch sensor prevents the touch sensor from being used in certain applications requiring particular flexibility or thinness. Also, the use of a second substrate increases the cost and complexity of the touch sensor assembly process. Further, these known touch sensors limit the integration of back-lighting, indicators and displays. When these features are included, they typically are located adjacent to the touch sensor or, alternatively, apertures must be created in the touch sensor electrodes to accommodate them.

SUMMARY OF THE INVENTION

To avoid the foregoing prior art problems, the present invention integrates touch sensor assemblies with decorations to create an aesthetic and ergonomic control panel face. Thus, according to the present invention, decorations are disposed on the touch sensor assembly itself and not on another substrate to which the touch sensor assembly would subsequently be attached.

Decorations according to the present invention can serve the purpose of alerting a touch sensor user to the location of a particular operative touch surface. They can also identify and distinguish particular operative touch surfaces from other operative touch surfaces and alert the touch sensor user to the particular function or response of a particular operative touch surface. For instance, decorations can label and distinguish operative touch surfaces either numerically or expressly by their particular function, or state, as by indicating "On" or "Off." Other displays, indicators and lighting features that can provide both decorative and functional benefits can also be more easily integrated with a touch sensor assembly made according to the present invention.

According to the present invention, decorations can be applied directly to the touch sensor substrate or on a separate carrier, such as a decal or film, when then is applied to and integrated with the touch sensor assembly. Some embodiments can include backlighting, wherein light can pass through at least portions of the decoration, thereby indicating the location on the panel of an operative touch surface corresponding to a particular touch sensor. In other embodiments, novel touch sensors can include integrated light pipes and substrates that efficiently accommodate back-lighting features. The present invention can be used in connection with any suitable touch sensor, as described below.

BRIEF DESCRIPTION OF THE DRAWINGS

FIGS. 8A-8D illustrate embodiments of the present invention involving configurations and structures that provide tactile feedback to the touch sensor user;

FIGS. 11A-11B illustrate embodiments of the present invention where a light pipe is borne on a carrier substrate beneath a decorative layer.

DETAILED DESCRIPTION OF THE DRAWINGS

While the drawings generally depict capacitive and electric field touch switches for the purpose of illustration, the principles of the present invention can be seen by those skilled in the art as appropriate for any manner of touch switch device, including, but not limited to, capacitive touch switches, infrared touch switches, electric field touch switches, acoustic touch switches and electromagnetic touch switches. Specific examples include the touch switches described in U.S. Pat. No. 5,594,222, No. 5,856,646, No. 6,310,611 and No. 6,320,282, each naming David W. Caldwell as inventor. The disclosures of the foregoing U.S. Patents are hereby incorporated herein by reference. The disclosures of U.S. Patent Publication No. 2003/0122455 A1. entitled Intelligent Shelving System, No. 2003/0121767 A1. entitled Molded|Integrated Touch Switch/Control Panel Assembly and method for Making Same, No. 2003/0122432 A1, entitled Touch Switch with Integral Control Circuit, No. 2003/0122794 A1, entitled Touch Sensor with Integrated Decoration, and No. 2003/0159910 A1, entitled Integrated Touch Sensor and Light Apparatus, all filed on Oct. 15, 2002 and all naming David W. Caldwell as an inventor, are also hereby incorporated herein by reference.

Figure 1:
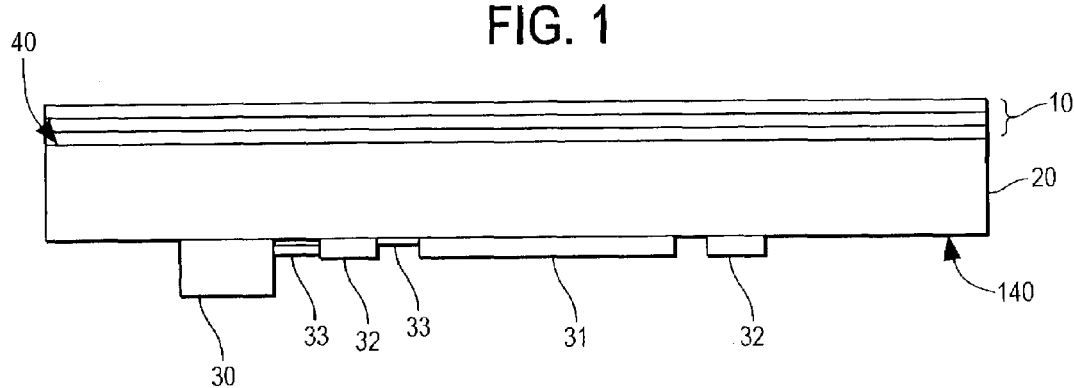
FIG. 1 illustrates an embodiment of the invention wherein a printed wiring board is embellished with a decorative layer.

FIG. 1 depicts an embodiment of the present invention wherein decorative layer 10 is disposed on a touch switch carrier substrate 20, such as a printed wiring board. Touch switch carrier substrate 20 functions as a carrier for at least portions of a touch sensor's electrical components, such as inner and outer electrodes 31 and 32, respectively, integrated control circuit 30, and circuit traces 33. In FIG. 1, decorative layer 10 is disposed on the touched side 40 of substrate 20, which is opposite the non-touched side 140 of substrate 20 which carries electrodes 31 and 32. Herein, "touched side" refers generally to the side of the wiring board or other substrate a user normally touches in order to activate the touch sensor, and "non-touched side" generally refers to the opposite side of the wiring board or substrate. Also, "decorative layer" refers generally to a decoration applied to substrate 20. Such decoration can be applied using, for example, screen printing, spray coating, ink jet printing, pad printing, dip coating or hot stamping techniques, or using, for example, an adhesive to affix a preprinted carrier, such as a decal or decorated film, to touched side 40. In the latter case, the decorative layer could be created off-line and applied to the touch sensor subassembly as an overlay. Other methods of decoration are feasible as well. Also, any combination of these methods of decorating substrate 20 may be used, according to the requirements of the application. These decorating techniques are appropriate for the embodiments depicted in all of the following drawings as well.

Figure 2A:
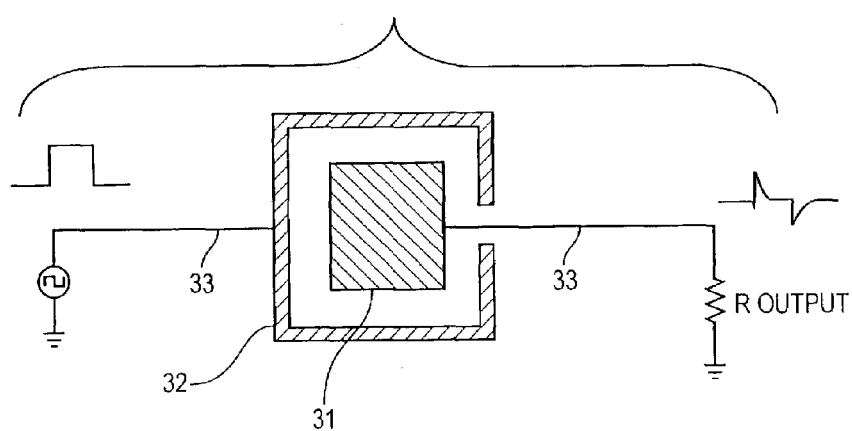
FIG. 2A illustrates the electrode structure of a typical capacitive touch sensor.
Figure 2B:
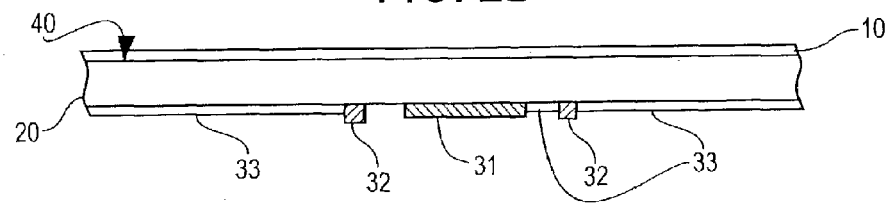
FIG. 2B illustrates a decorative layer disposed on the touch surface side of a component carrier substrate.
Figure 2C:
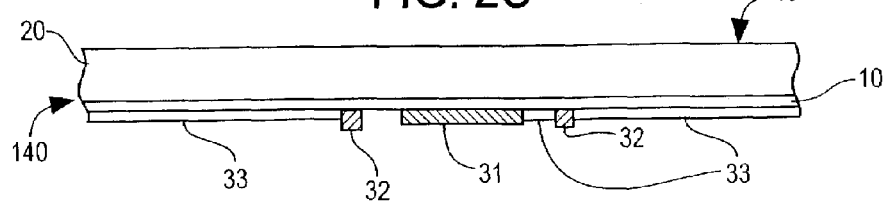
FIG. 2C illustrates a decorative layer disposed on the component bearing side of a component carrier substrate.

FIG. 2A is a partially schematic top plan view of a capacitive touch sensor, including inner and outer electrodes 31 and 32 and circuit traces 33. FIGS. 2B-2C show the capacitive touch sensor of FIG. 2A borne on substrate 20. In FIG. 2B, decorative layer 10 is shown disposed on touched side 40 of substrate 20. FIG. 2C shows an embodiment of the present invention wherein decorative layer 10 and electrodes 31 and 32 and traces 33 are on the same side of substrate 20. In FIG. 2C, decorative layer 10 is shown disposed on the non-touched side 140 of substrate 20, with electrodes 31 and 32 and traces 33 disposed on decorative layer 10, so that decorative layer 10 is between substrate 20 and electrodes 31 and 32 and traces 33. Substrate 20 may be a printed wiring board, as in FIG. 1, made of, for example, FR-R or CEM. Alternatively, substrate 20 may be made of glass, plastic or any suitable dielectric material. Substrate 20 can be a flexible circuit carrier made of material such as polyester, PEN or polyimide. In the FIG. 2C embodiment, at least a portion of substrate 20 preferably is transparent to allow viewing of the decorative layer 10 from the touched side 40 of substrate 20.

Figure 3A:
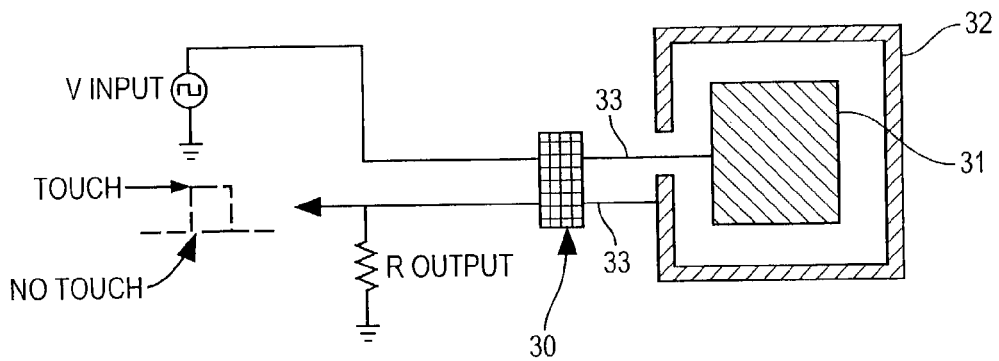
FIG. 3A illustrates the electrode structure of a touch switch with integral control circuit.
Figure 3B:
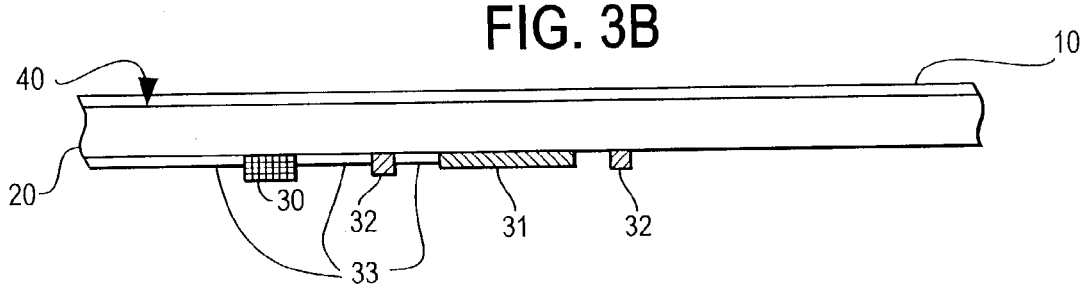
FIG. 3B illustrates a decorative layer disposed on the touch surface side of a component carrier substrate.
Figure 3C:
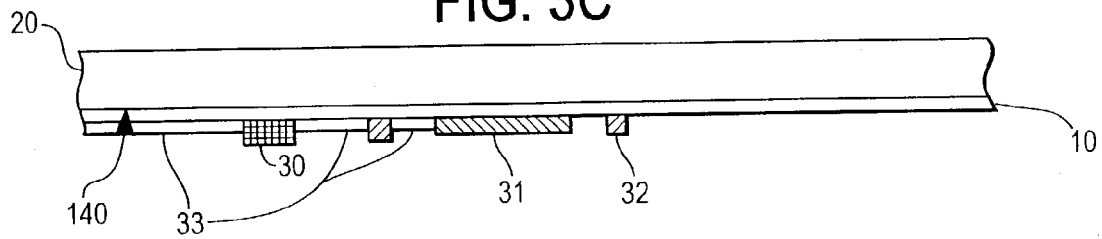
FIG. 3C illustrates a decorative layer disposed on the component bearing side of a component carrier substrate.

FIG. 3A is a partially schematic top plan view of a touch sensor including integrated control circuit 30, inner and outer electrodes 31 and 32, respectively, and circuit traces 33. FIG. 3B shows the touch sensor of FIG. 3A borne on substrate 20, with decorative layer 10 disposed on touched side 40. In FIG. 3C, decorative layer 10 is shown disposed on the non-touched side 140 of substrate 20 between substrate 20 and the touch sensor components, namely, electrodes 31 and 32 and traces 33. In the FIG. 3C embodiment, at least a portion of substrate 20 preferably is transparent to allow viewing of the decorative layer 10 from the touched side 40 of substrate 20.

FIG. 4A-7D illustrate embodiments of the present invention that incorporate various illumination techniques. In these embodiments, at least a portion of substrate 20 must be transparent or translucent to allow light to pass therethrough, as will become evident from the following description and from the drawings.

Figure 4A:
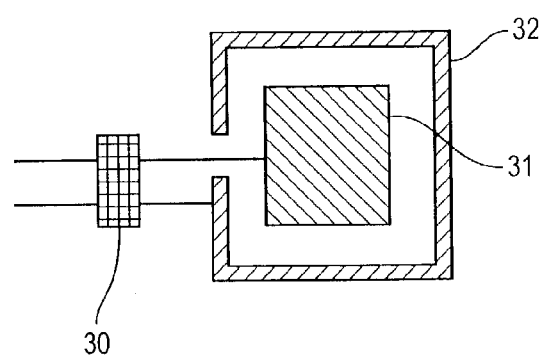
FIGS. 4A-4B illustrate an embodiment of the present invention having a light emitting diode that illuminates a decorative layer disposed on a substrate that carries the touch pad and integrated control circuit of a touch sensor.

FIG. 4A is a partially schematic top plan view of a touch sensor for use in applications involving back lighting. In this embodiment, inner electrode 31 can be, but need not be, transparent or translucent. In embodiments wherein inner electrode 31 is transparent or translucent, light emanating from light emitting diode 50 of FIG. 4B can pass thorugh inner electrode 31 to reach decorative layer 10. Inner electrode 31 can also be of various shapes forming outlines of symbols or figures or might even be a fine mesh, allowing only a portion of light from light emitting diode 50 to pass therethrough and reach the surface of touched side 40. Although the touch sensor shown in FIGS. 4A-B includes integrated control circuit 30, other touch sensor configurations, such as capacitive touch sensor configurations, also can be used in connection with this embodiment of the invention.

Viewing area 57 represents an area of decorative layer 10 through which light can pass. Decorative layer 10 may be transparent or translucent at viewing area 57 or it may include an aperture (as shown in FIG. 5B) aligned with viewing area 57 that allows light from light emitting diode 50 to pass through at least a portion of decorative layer 10 within viewing area 57 to reach the outer surface 60 of decorative layer 10 and beyond to a user (not shown). In this embodiment, light emitting diode 50 is borne on a separate carrier substrate 22 such that electrodes 31 and 32 are located between separate carrier substrate 22 and substrate 20, although other configurations are also possible. Separate carrier substrate 22 may be of any composition and can be composed of the same materials as the substrates described above. Also, separate carrier substrate 22 may be decorated according to any of the principles of this invention as well. Light emitting diode 50 could be replaced with any suitable light source, including a light pipe, incandescent bulb, electroluminescent lamp, light emitting polymer, fluorescent light, and so on.

Figure 4B:
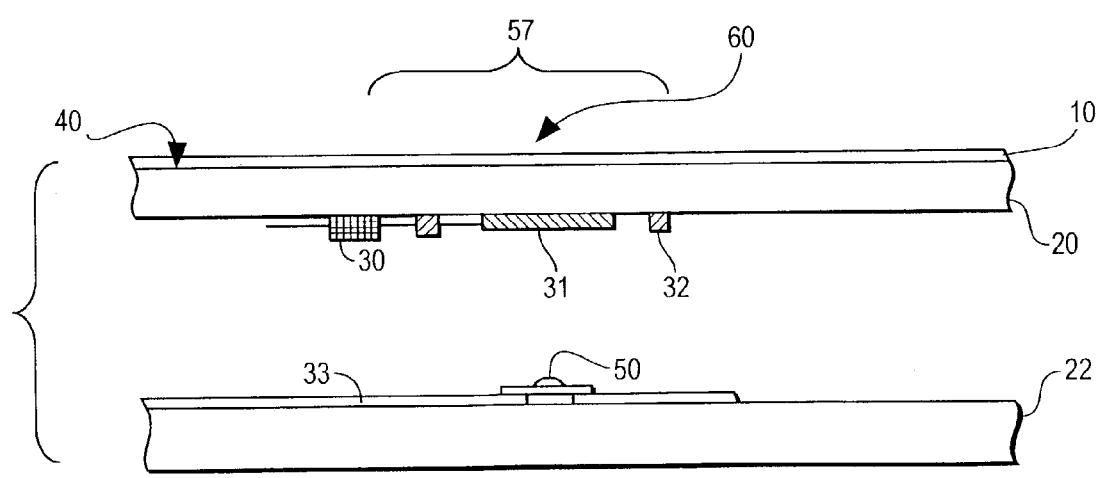
Figure 5A:
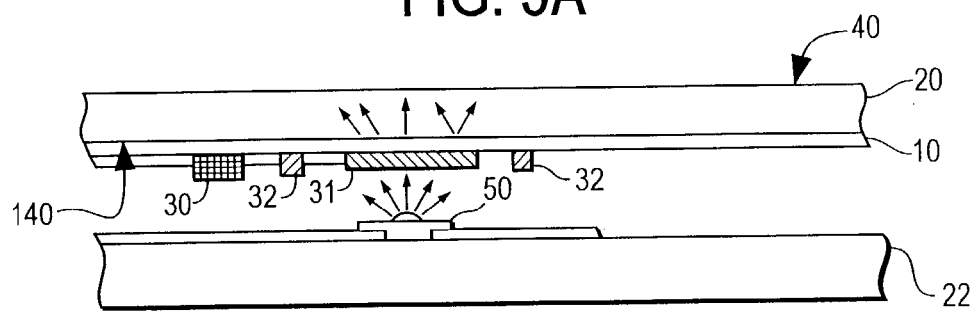
FIGS. 5A-5C illustrate an embodiment of the present invention having a light emitting diode that illuminates a slit in a decorative layer disposed on a substrate that carries the touch pads and integrated control circuit of a touch sensor.
Figure 5B:
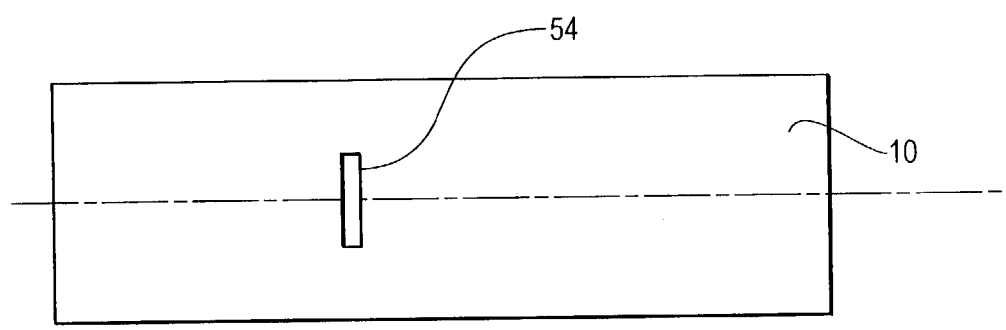
Figure 5C:
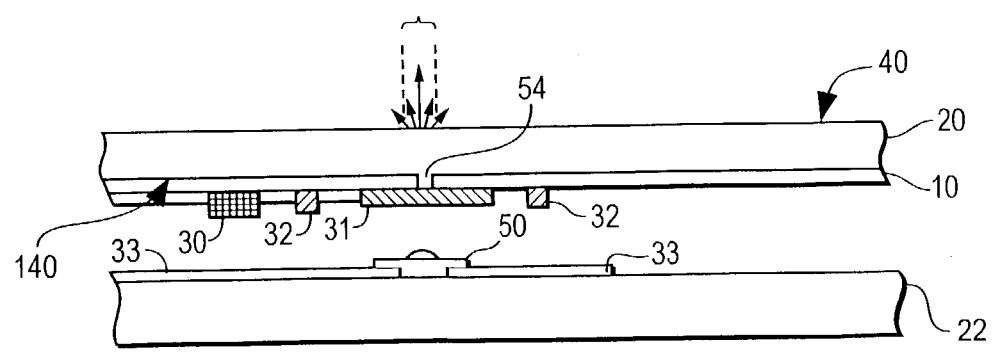
Figure 6A:
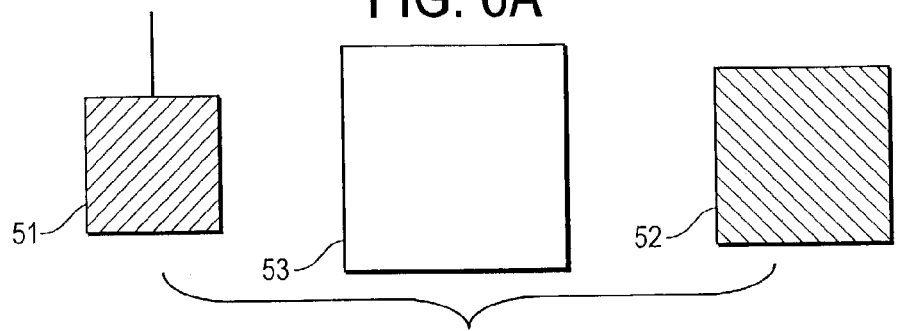
FIGS. 6A-6E illustrate a touch sensor with an integrated light emitting device.
Figure 6B:
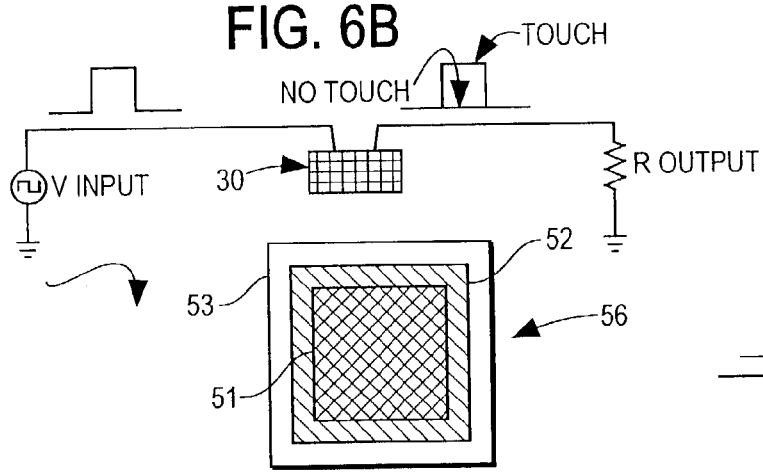
Figure 6C:
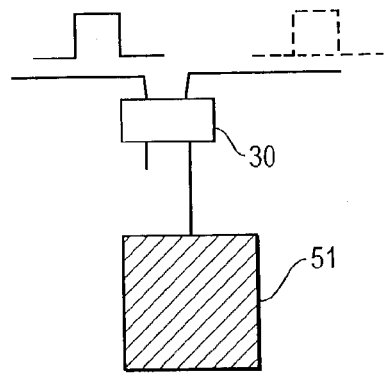
Figure 6D:
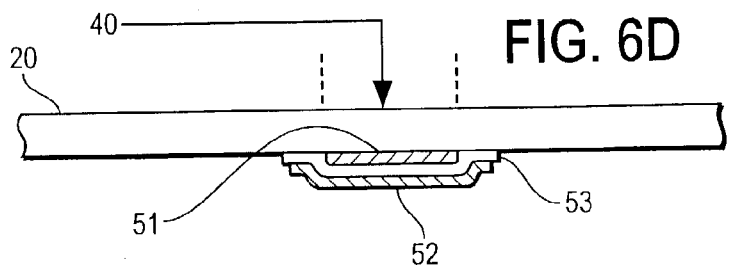
Figure 6E:
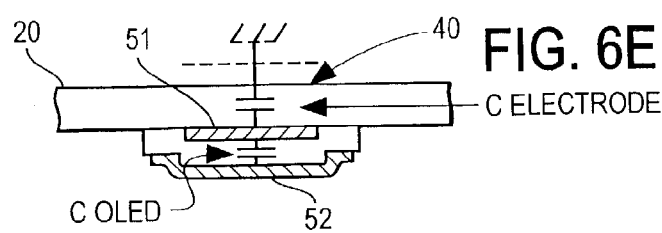

FIGS. 5A and 5C show the embodiment of FIG. 4B, including inner electrode 31, outer electrode 32 and integrated control circuit 30, but with decorative layer 10 disposed on the non-touched side 140 of substrate 20 instead of on touched side 40. FIG. 5B shows an example of decorative layer 10 configured to allow light from light emitting diode 50, in FIG. 5C, to reach the surface of touched side 40. In FIG. 5B, decorative layer 10 defines an aperture 54 that allows light to reach the outer surface 40 of decorative layer 10 and beyond to a user (not shown), as illustrated in FIG. 5C.

Figure 7A:
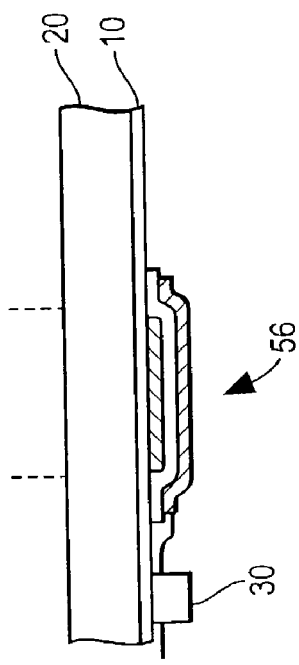
FIGS. 7A-7D illustrate embodiments of the present invention having touch sensors according to the invention of U.S. patent application Ser. No. 10/850,272, entitled Integrated Touch Sensor and Light Apparatus, wherein decorative layers are disposed on substrates that carry the touch sensor and integrated light emitting device depicted in FIG. 6D.
Figure 7B:
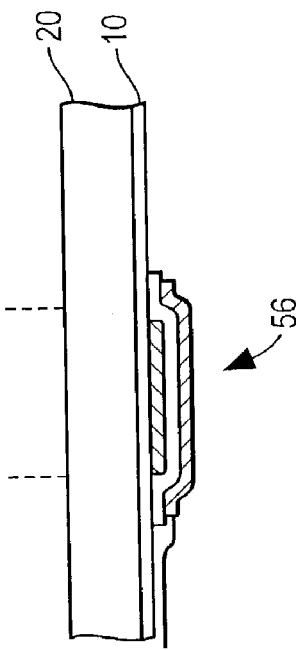
Figure 7C:
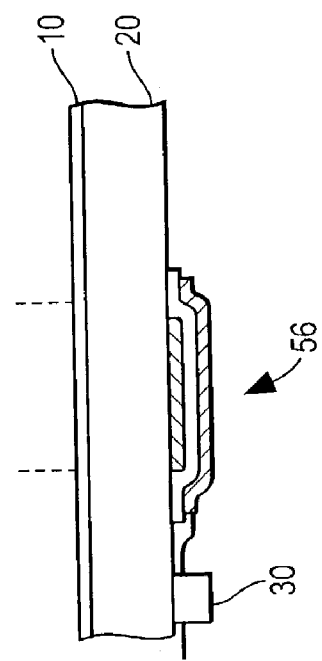
Figure 7D:
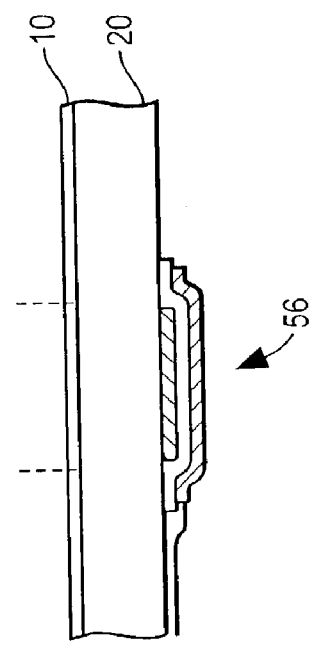

FIGS. 6A-7D depict another embodiment of the present invention involving the novel integrated touch sensor and light emitting device of copending and commonly owned U.S. patent application Ser. No.10/850,272, entitled Integrated Touch Sensor and Light Apparatus, the disclosure of which has been incorporated herein by reference. Transparent conductive anode layer 51, cathode layer 52 and light emitting layer 53 of FIG. 6A form the light source and touch pads of the integrated touch sensor and light emitting device 56 with integrated control circuit 30 of FIG. 6B. FIG. 6C shows the touch sensing components of the integrated touch sensor and light emitting device of FIG. 6D, including anode layer 51 coupled to integrated control circuit 30. Substrate 20, having touched side 40, of FIGS. 6D-6E may be decorated according to the principles of the present invention as shown in FIGS. 7A-7B, which show the integrated touch sensor and light emitting device 56 with integrated control circuit 30 of FIG. 6B, and as shown in FIGS. 7C-7D, which show an integrated touch sensor and light emitting device 56 without an integrated control circuit.

FIGS. 8A-8B show an embodiment of the present invention wherein decorative layer 10 includes a textured portion 160. Textured portion 160 may be disposed in locations on or near touch surface 240 (representing an area where a stimulus such as touch or near approach of a human appendage or other object must be provided in order to trigger an underlying touch sensor) corresponding to a particular touch sensor or touch pad to provide a more ergonomic control panel interface by providing tactile and/or visual feedback to a user who will be more aware of the location of the practical boundaries of touch surface 240. Texture of various sorts can be achieved using any of the various decorating methods discussed above as well as using other techniques. For example, textured portion 160 may be achieved through multiple layering of material at certain locations on or near touch surface 240, as shown in FIG. 8A, or by incorporating inconsistencies in certain areas of decorative layer 10, as by stippling, sputter printing, stamping, scoring or other methods, as shown in FIG. 8B. FIGS. 8C-8D show an embodiment of the present invention involving tactile and visual feedback in the form of a dome 65 located proximate touch surface 240. In such embodiments, the touch sensor underlying a dome 65 preferably is configured so as to not be triggered by an appendage, such as a finger, simply resting upon the dome, but to be triggered when the dome is depressed or "flattened out" against the surface 40 of substrate 20. Dome 65 can be an integral part of decorative layer 10, as in FIG. 8C. Alternatively, it can be composed of structure 67 separate from decorative layer 10, as shown in FIG. 8D, where structure 67 is shown both covered by decorative layer 10 and uncovered by decorative layer 10. Dome 65 may also provide aural feedback in applications where such feedback would be advantageous. Aural feedback could be a popping or clicking sound produced by the transition of the dome between its steady-state dome shape and a depressed state.

FIGS. 9A-10B depict embodiments of the present invention involving backlighting using light pipes. The embodiments depicted in these drawings can involve touch pads including single electrodes or both inner and outer electrodes, and can involve an integrated control circuit proximate the touch pad as well.

The use of light pipes in applications like automotive dashboards, membrane switches and other electronic applications is common. Light pipes can enhance the legibility and usability of displays on interfaces. Light pipes can be advantageously used in conjunction with the principles of the present invention to provide an improved ergonomic display for touch sensor interfaces.

Figure 9A:
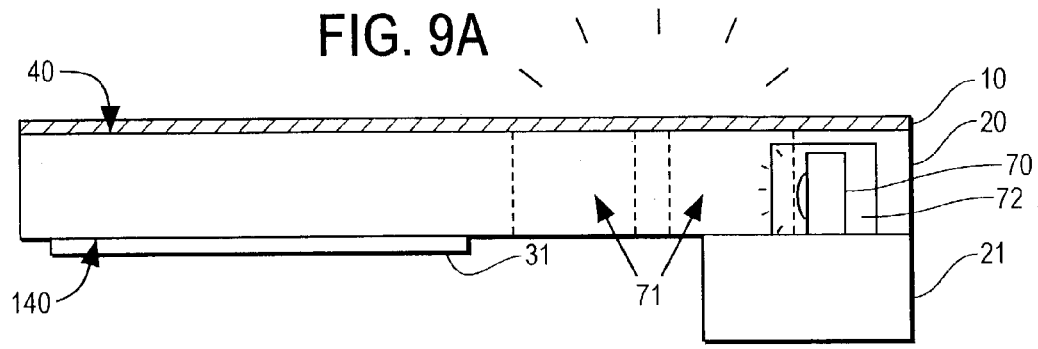
FIGS. 9A-9C illustrate embodiments of the present invention involving substrates that also function as light pipes which can illuminate the decorative layer disposed thereon.
Figure 9B:
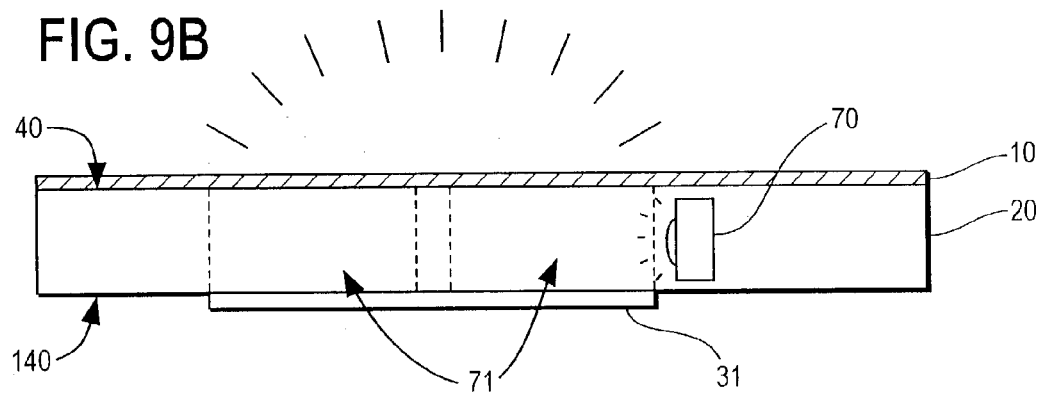
Figure 9C:
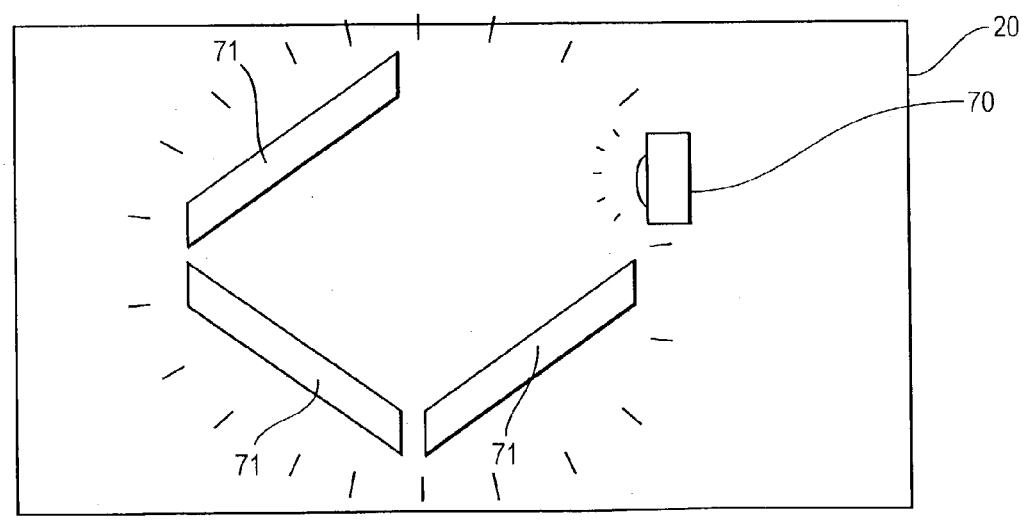

FIGS. 9A-9C depict embodiments of the present invention wherein substrate 20 is a light pipe. Substrate 20 is advantageously entirely transparent, but need not be. Slots 71 can be configured to allow enough light from light source 70 to illuminate the desired areas at the surface of touched side 40 in embodiments involving light pipe 171, including embodiments where substrate 20 is not entirely transparent. Substrate 20 can include cutout section 72 to accommodate light source 70. Substrate 21 can include a similar cutout (not shown), as desired. Alternatively, light source 70 can be molded directly into substrate 20, as shown in FIG. 9B. The embodiment of the present invention shown in FIG. 9B is compatible with the principles of the invention disclosed in U.S. Patent Applications Ser. No. 60/341,350 and Ser. No. 10/850,272, entitled Integrated Touch Sensor and Light Apparatus, which have been incorporated herein by reference. Light source 70 can be any suitable light emitting component, including, but not limited to, an LED, OLED, LEP, other electroluminescent device, electroflourescent device or standard incandescent bulb.

As shown in FIG. 9C, light source 70 emits light that can be refracted by slots 71 of substrate 20. Slots 71 guide the light emitted from light source 70 to advantageously provide uniform illumination of an area near or aligned with electrode 31, as would be understood by those skilled in the art of optics. Slots 71 can be of various configurations. In FIG. 9A, the illumination is shown near electrode 31, where as in FIG. 9B the illumination is shown aligned with electrode 31. Since light source 70 can be located in cutout section 72 of substrate 20 or be molded into substrate 20, decorative layer 10 in FIG. 9A is shown advantageously disposed on the surface of touched side 40. If desired, light source 70 might preferably be visible at the surface of touched side 40. In these applications, decorative layer 10 can be disposed on non-touched side 140 of substrate 20. Also, both light source 70 and slots 71 can be covered by a touch pad framing substrate (not shown) atop substrate 20 that can hide both light source 70 and slots 71, allow decorative layer 10 to be disposed on the non-touched side 140 of substrate 20 and frame the illuminated area, without needlessly increasing the distance between electrode 31 and the surface of touched side 40.

Figure 10A:
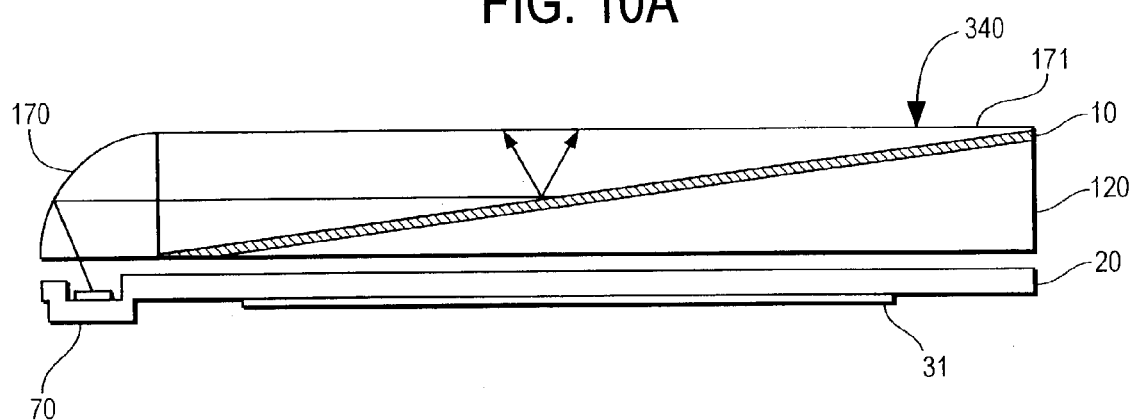
FIGS. 10A-10B illustrate embodiments of the present invention involving substrates that also function as light pipes, where light is reflected off of the decorative layer disposed within the substrate.
Figure 10B:
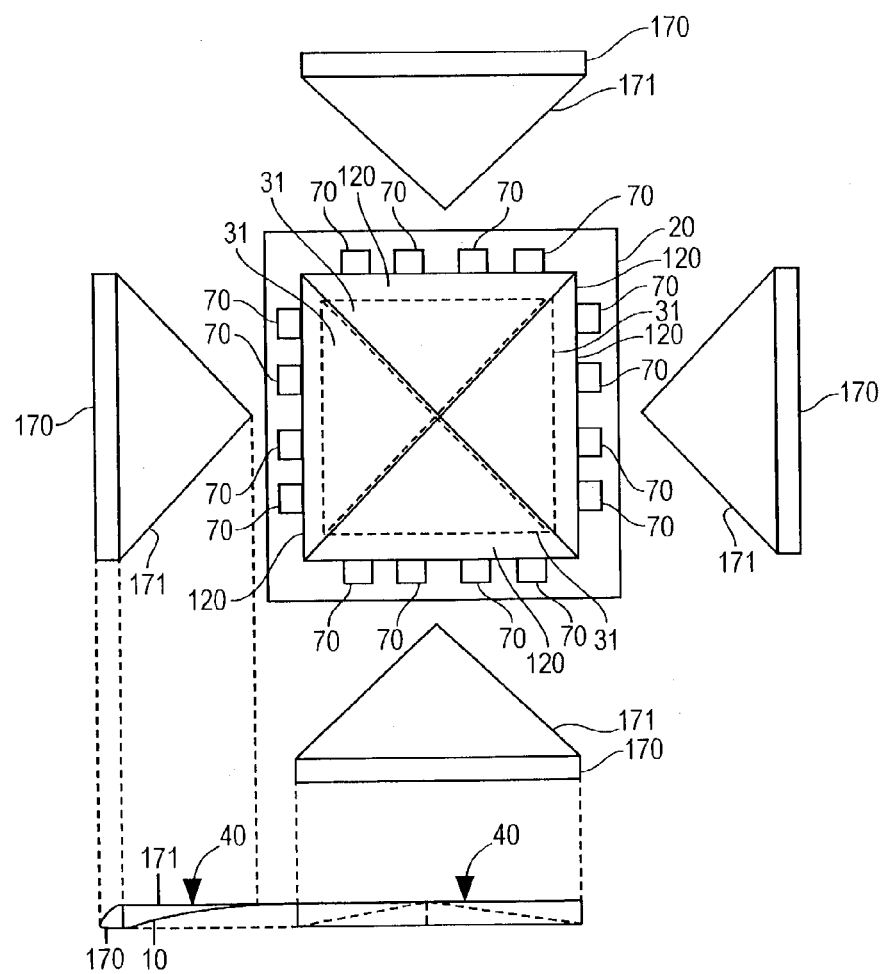

FIGS. 10A-10B also depict embodiments of the present invention using light pipes. FIG. 10A shows a touch sensor having a single electrode 31 with an integrated decorative layer 10 disposed between light pipe 171 and spacer wedge 120. Diffuse reflector 170 reflects light from light source 70 into light pipe 171 where it can reflect off of the surface of decorative layer 10 and allow light to reach the touch sensor user at the surface of touched side 340. Spacer wedge 120 advantageously keeps touched side 340 and electrode 31 parallel. In alternate embodiments, space wedge 120 can be omitted. Spacer wedge 120, however, advantageously provides an incident angle to reflect light better and more uniformly than might be possible without it. In alternate embodiments, light can be reflected in a substantially uniform fashion, for example, when light pipe 171 is composed of a diffuse material and substrate 20 is composed of a reflective material. Light source 70 and electrode 31 can be borne by substrate 20, as shown in FIG. 10A, on diffuse reflector 170 and spacer wedge 120, respectively, or otherwise. Light source 70 can be any suitable light source, including the light sources discussed above. Light source 70 can be configured so that, upon stimulation of electrode 31, by a user's touch of touched side 340, light source 70 emits light through diffuse reflector 170 and into light pipe 171, providing feedback to the user that the touch induced a response in the touch sensor control circuit. Diffuse reflector 170 can ensure the efficient coupling of light from light source 70, located adjacent to light pipe 171, into light pipe 171. Light pipe 171 can ensure the uniform illumination of touched surface 40. Alternately, light pipe 171 could be integrated with an optical switching mechanism. For instance, an infrared detector (not shown) could detect the inherent body heat of a user's touch through light pipe 171. Or an emitter-detector pair (not shown) could detect the shadow of a user's approaching touch through light pipe 171. It will be understood that light pipe 171 could be any suitable optical device, including a waveguide or a lens. FIG. 10B shows a possible configuration of integrated touch sensors according to the present invention. In FIG. 10B, triangular spacer wedges 120 overlie complementary electrodes 31. When the configuration defined by diffuse reflector 170 and light pipe 171 overlies associated spacer wedge 120, diffuse reflector 170 aligns with light source 70, as shown in FIG. 10A. Decorative layer 10 can advantageously differentiate among touch sensors by changing the color of light from light source 70. Alternately, lights 70 could emit different wavelengths of light for each separate touch sensor.

FIGS. 11A-11B depict other embodiments of the present invention that include light pipes. In FIG. 11A, electrodes 31 and 32 and light emitting device 50 are borne on substrate 20. Light pipe 171 is also borne on substrate 20 and can be dispensed, molded and the like. Decorative layer 10 is disposed atop electrodes 31 and 32. Light pipe 171 may be cured using thermal or ultraviolet techniques, or the like, to conform to the electrodes 31 and 32 and light emitting device 50 borne on substrate 20. Also shown in FIG. 11A is a second decorative layer 110, disposed atop light pipe 171. In FIG. 11A, second decorative layer 110 is shown having section 154, which can be transparent or translucent to allow light from light emitting device 50 to reach touched side 40. Section 154 is optional and in alternate embodiments can be obviated when second decorative layer 110 includes an aperture (not shown) as described with reference to FIGS. 5B and 5C. The embodiments depicted in FIG. 11A also advantageously have raised surface 440, which can alert a touch sensor user to the presence of an operative touch surface in a manner similar to the textured areas and domes of FIGS. 8A-8D. FIG. 1B shows a similar embodiment of the present invention where electrodes 31 and 32, light emitting device 50 and integrated control circuit 30 are borne on the opposite, non-touched side 140 of substrate 20. In these configurations, light from light emitting device 50 must first pass through substrate 20 before reaching light pipe 171, which illuminates section 154. The embodiment in FIG. 11B advantageously allows light pipe 171 to be borne on substrate 20 without having to conform to electrodes 31 and 32, light emitting device 50 or other components. In FIGS. 11A-11B, light emitting device could be mounted on substrate 20 using wire-bonding, flip chip or other direct die attachment methods in addition to using standard surface mount packaging of plastic encapsulated parts on either side of substrate 20. The light pipes 171 and other components of these configurations could also be decorated according to the principles of the present invention as described above. Although in FIGS. 11A and 11B light pipe 171 is shown nearer touched side 40, light pipe 171 can also be advantageously be borne on non-touched side 140 of substrate 20.

Although the touch sensors herein are shown having inner and outer electrodes, the inner or outer electrode can be eliminated in some embodiments. Moreover, the present invention can be used with any type of touch sensor, including capacitive touch sensors or touch switches with integrated control circuits. The principles of the present invention are also compatible with the inventions of other commonly owned and assigned applications. For instance, a touch sensor with an integrated decorative substrate can involve the novel circuitry of U.S. Patent Application Ser. No. 60/341,551 and also can include the integrated lighting of the invention disclosed in U.S. Patent Application Ser. No. 60/341,350. Moreover, a touch sensor with an integrated decorative substrate can also include substrates that are thermoformed or injection molded onto the decorated substrates according to the invention disclosed in U.S. Patent Application Ser. No. 60/341,550 and Ser. No. 10/850,272, entitled Molded/Integrated Touch Switch/Control Panel Assembly and Method for Making Same, which have been incorporated herein by reference.

The preceding drawings serve to illustrate, but neither limit nor exhaust, the principles of the present invention. Various alterations to the embodiments described above are in keeping with the spirit of the invention and will be understood by those skilled in the art to be a part of the present invention claimed below.

I claim:

1. A control interface for a controlled device, said control interface comprising:
   a printed wiring board;
   a decoration integrally disposed on said printed wiring board, either directly or in the form of a thin overlay;
   a touch sensor comprising at least one thin conductive electrode pad disposed on at least one of said decoration and said printed wiring board;
   a conductive trace disposed on at least one of said decoration and said printed wiring board, said conductive trace electrically coupled to said touch sensor; and
   a touch surface corresponding to said electrode pad, said touch surface separated from said electrode pad by at least said printed wiring board and said touch surface coinciding with at least one of said decoration and said printed wiring board;
   said decoration identifying the location of said touch surface and said decoration being visible from said touch surface.

2. The control interface of claim 1 further comprising a light pipe disposed on at least one of said decoration and said printed wiring board.

3. The control interface of claim 1, further comprising a light source in association with said printed wiring board, wherein said light source illuminates at least a portion of said decoration.

4. The control interface of claim 3 wherein said light source is integrated with said touch sensor.

5. The control interface of claim 1, further comprising tactile structure associated with said touch surface, said tactile structure providing tactile identification of the location of said touch surface.

6. A control interface for a controlled device comprising:
a flexible electrical circuit carrier;
a decoration integrally disposed on said circuit carrier, either directly or in the form of a thin overlay;
a touch sensor comprising at least one thin conductive electrode pad disposed on at least one of said decoration and said circuit carrier;
a conductive trace disposed on at least one of said decoration and said circuit carrier, said conductive trace electrically coupled to said touch sensor; and
a touch surface corresponding to said electrode pad, said touch surface separated from said electrode pad by at least said circuit carrier and said touch surface coinciding with at least one of said decoration and said circuit carrier;
said decoration identifying the location of said touch surface and said decoration being visible from said touch surface.

7. The control interface of claim 6 further comprising a light pipe disposed on at least one of said decoration and said circuit carrier.

8. The control interface of claim 6, further comprising a light source in association with said circuit carrier, wherein said light source illuminates at least a portion of said decoration.

9. The control interface of claim 8 wherein said light source is integrated with said touch sensor.

10. The control interface of claim 8, wherein said electrode pad is substantially transparent.

11. The control interface of claim 8, wherein at least a portion of said circuit carrier is substantially transparent.

12. The control interface of claim 6, further comprising tactile structure associated with said touch surface, said tactile structure providing tactile identification of the location of said touch surface.

13. A control interface for a controlled device comprising:
a light pipe;
a light source optically connected to said light pipe;
a decoration integrally disposed on said light pipe, either directly or in the form of a thin overlay;
a touch sensor comprising at least one thin, conductive electrode pad disposed on at least one of said decoration and said light pipe; and
a touch surface corresponding to said electrode pad, said touch surface separated from said electrode pad by at least said light pipe and said touch surface coinciding with at least one of said decoration and said light pipe;
said decoration identifying the location of said touch surface, said decoration being visible from said touch surface.

14. The control interface of claim 13, wherein said electrode pad is substantially transparent.

15. A method of using an electric circuit carrier to control a controlled device, comprising the steps of:

disposing a decoration integrally on said circuit carrier, either directly or in the form of a thin overlay;
disposing a touch sensor comprising at least one thin conductive electrode pad on at least one of said decoration and said circuit carrier;
defining a touch surface corresponding to said electrode pad, said touch surface coinciding with at least one of said decoration and said circuit carrier and said touch surface separated from said electrode pad by at least said circuit carrier, said decoration identifying the location of said touch surface;
connecting said circuit carrier to said controlled device such that said decoration is visible to a user and said touch surface is accessible to said user for touch by said user.

16. The method of claim 15 wherein said step of connecting said carrier to said controlled device further comprises connecting said carrier with said controlled device such that said touch surface forms an exterior surface of said controlled device.

17. A control interface for a controlled device comprising:
a light pipe having a non-uniform cross section;
a light source optically connected to said light pipe;
a decoration integrally disposed on said light pipe, either directly or in the form of a thin overlay;
a touch sensor comprising at least one thin, conductive electrode pad operably associated with said light pipe; and
a touch surface corresponding to said electrode pad, said touch surface separated from said electrode pad by at least said light pipe, said touch surface coinciding with said light pipe;
said decoration being visible from said touch surface.

18. The control interface of claim 17 further comprising a spacer interposed between said decoration and said touch sensor.

19. The control interface of claim 17 wherein said light pipe has a wedge-shaped cross-section.

20. The control interface of claim 17 further comprising:
a second light pipe;
a second light source optically connected to said second light pipe, said second light pipe operably associated with said touch sensor;
a second decoration integrally disposed on said second light pipe, either directly or in the form of a thin overlay; and
a second touch surface corresponding to said electrode pad, said second touch surface separated from said electrode pad by at least said second light pipe, said second touch surface coinciding with said second light pipe;
said second decoration being visible from said touch surface.

* * * * *

UNITED STATES PATENT AND TRADEMARK OFFICE
CERTIFICATE OF CORRECTION

| | | |
|---|---|---|
| PATENT NO. | : 7,242,393 B2 | Page 1 of 1 |
| APPLICATION NO. | : 10/272047 | |
| DATED | : July 10, 2007 | |
| INVENTOR(S) | : David W. Caldwell | |

It is certified that error appears in the above-identified patent and that said Letters Patent is hereby corrected as shown below:

Column 3, line 27, delete "A1." and insert -- A1, --

Column 3, line 28, delete "A1." and insert -- A1, --

Column 3, line 28, delete "MoldedlIntegrated" and insert -- Molded/Integrated --

Column 7, line 59, delete "FIG. 1B" and insert -- FIG. 11B --

Signed and Sealed this

Twenty-third Day of October, 2007

JON W. DUDAS
*Director of the United States Patent and Trademark Office*